(12) United States Patent
Yasuda et al.

(10) Patent No.: US 7,378,840 B2
(45) Date of Patent: May 27, 2008

(54) HOLDING STRUCTURE OF AN ELECTRONIC COMPONENT AND A METHOD FOR HOLDING THE SAME

(75) Inventors: Keiji Yasuda, Handa (JP); Masahiro Kimura, Chiryu (JP); Hisayoshi Okuya, Nishio (JP); Hidetoshi Yata, Okazaki (JP); Hiroyoshi Ito, Obu (JP); Masayuki Nishiguchi, Aichi-ken (JP); Naoki Mizuno, Nagoya (JP)

(73) Assignees: Aisin Seiki Kabushiki Kaisha, Kariya-Shi, Aichi-Ken (JP); Toyota Jidosha Kabushiki Kaisha, Toyota-Shi, Aichi-Ken (JP)

( * ) Notice: Subject to any disclaimer, the term of this patent is extended or adjusted under 35 U.S.C. 154(b) by 827 days.

(21) Appl. No.: 10/309,121

(22) Filed: Dec. 4, 2002

(65) Prior Publication Data
US 2003/0121822 A1 Jul. 3, 2003

(30) Foreign Application Priority Data
Dec. 5, 2001 (JP) .............................. 2001-371774

(51) Int. Cl.
*G01B 7/30* (2006.01)
(52) U.S. Cl. .............................. 324/207.25; 324/207.2
(58) Field of Classification Search .......... 324/207.25, 324/207.2, 174, 251; 338/32 H; 206/701, 206/719
See application file for complete search history.

(56) References Cited
U.S. PATENT DOCUMENTS
2001/0030534 A1  10/2001  Apel

FOREIGN PATENT DOCUMENTS

| DE | 34 42 951 A1 | 5/1986 |
|----|----|----|
| DE | 199 28 565 A1 | 1/2001 |
| DE | 200 03 512 U1 | 6/2001 |
| EP | 0 363 738 A2 | 4/1990 |
| EP | 1 096 234 A1 | 5/2001 |
| EP | 1 120 626 A2 | 8/2001 |
| JP | 9-304415 A | 11/1997 |
| JP | 2001-124511 | 5/2001 |
| JP | 2001-141738 A | 5/2001 |
| JP | 2001-188003 | 7/2001 |
| JP | 2001-289610 A | 10/2001 |

OTHER PUBLICATIONS

Corresponds to EP 1 096 234 A1.
Official Letter issued by German Patent Office and English language translation of same, 10256709.3-34 May 11, 2007.

*Primary Examiner*—Reena Aurora
(74) *Attorney, Agent, or Firm*—Buchanan Ingersoll & Rooney PC

(57) ABSTRACT

A holding structure of an electronic component includes a first resin mold formed by resin insert molding with a terminal. The first resin mold possesses a positioning portion for positioning the electronic component to be electrically connected to the terminal. The holding structure includes a second resin mold formed by resin insert molding with the terminal and surrounding the first resin mold and the electronic component. The electronic component has been positioned by the first resin mold and has been electrically connected to the terminal.

19 Claims, 2 Drawing Sheets

HOLDING STRUCTURE OF AN ELECTRONIC COMPONENT AND A METHOD FOR HOLDING THE SAME

CROSS REFERENCE TO RELATED APPLICATIONS

This application is based on and claims priority under 35 U.S.C. § 119 with respect to a Japanese Patent Application 2001-371774, filed on Dec. 5, 2001, the entire content of which is incorporated herein by reference.

FIELD OF THE INVENTION

This invention generally relates to a holding structure of an electronic component and a method for holding the electronic component.

BACKGROUND OF THE INVENTION

A conventional holding structure of an electronic component is disclosed, for example in a Japanese Patent Laid-Open No. 2001-188003. According to the holding structure of the electronic component disclosed therein, a resin spacer positions a Hall IC (a Hall effect element) as the electronic component. The Hall IC is arranged at a central portion of a gap as a magnetic flux detection gap portion defined in a stator core and terminals of the Hall IC are connected to a connector pin (a terminal) by using welding or the like. A connector housing is formed by resin-molding the Hall IC, the spacer, the stator core, and the connector pin as a single unit. The Hall IC is held at a predetermined position of the connector housing.

According to the above-described holding structure, the Hall IC and the spacer can be positioned relative to each other. However, it seems to be difficult to position the spacer (and the Hall IC) and the connector pin relative to each other for the following reasons. The spacer and the connector pin are assembled individually. In this case, a dimensional variation may be caused to each component and assembling errors may be further, caused when being assembled. Therefore, detecting precision of magnetic flux fluctuation by the Hall IC may be deteriorated due to displacement of the Hall IC in the connector housing.

Accordingly, the present invention therefore seeks to provide an improved holding structure of an electronic component and an improved method for holding the electronic component, whereby positioning precision for positioning the electronic component can be improved.

SUMMARY OF THE INVENTION

According to an aspect of the present invention, a holding structure of an electronic component includes a first resin mold formed by resin insert molding with a terminal. The first resin mold possesses a positioning portion for positioning the electronic component to be electrically connected to the terminal. The holding structure of the electronic components further includes a second resin mold formed by resin insert molding with the terminal and covering the first resin mold and the electronic component. The electronic component has been positioned by the first resin mold and has been electrically connected to the terminal. The electronic component can be disposed in the positioning portion. Additionally, the positioning portion can possesses an approximately cup shape for disposing the electronic component therein. The electronic component is a magnetic detecting element arranged at a predetermined position relative to a rotor for changing a generated magnetic flux in response to a rotation angle thereof.

According to another aspect of the present invention, a method for holding an electronic component includes the step of forming a first resin mold by resin insert molding with a terminal. The first resin mold possesses a positioning portion for positioning the electronic component to be electrically connected to a terminal. The method for holding the electronic component further includes the step of forming a second resin mold by resin insert molding with the terminal. The second resin mold covers the first resin mold and the electronic component being positioned by the first resin mold and being electrically connected to the terminal.

BRIEF DESCRIPTION OF THE DRAWING FIGURES

The foregoing and additional features and characteristics of the present invention will become more apparent from the following detailed description considered with reference to the accompanying drawing figures wherein.

DETAILED DESCRIPTION OF THE INVENTION

Figure 1A:
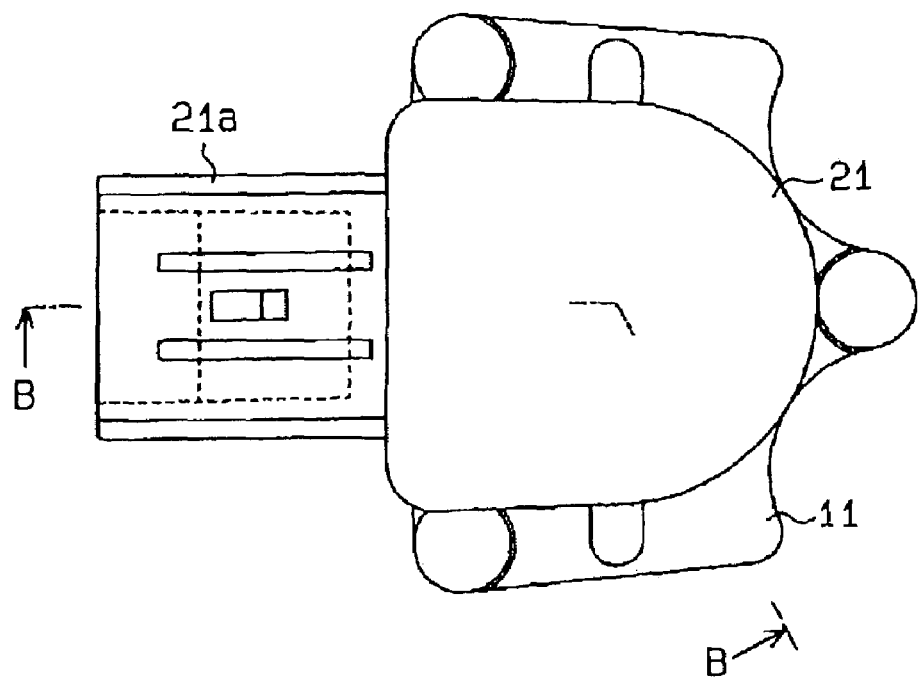
FIG. 1(a) is a plan view illustrating a rotation angular detecting device according to an embodiment of the present invention.
Figure 1B:
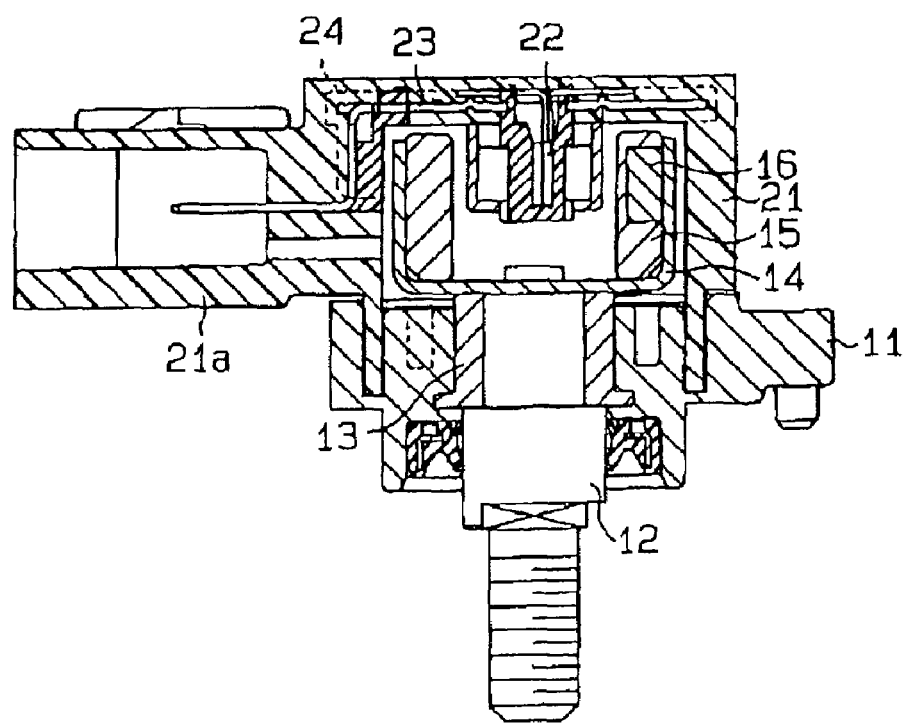
FIG. 1(b) is a cross sectional view of the embodiment of the present invention, taken along a line B-B in FIG. 1(a)
Figure 2:
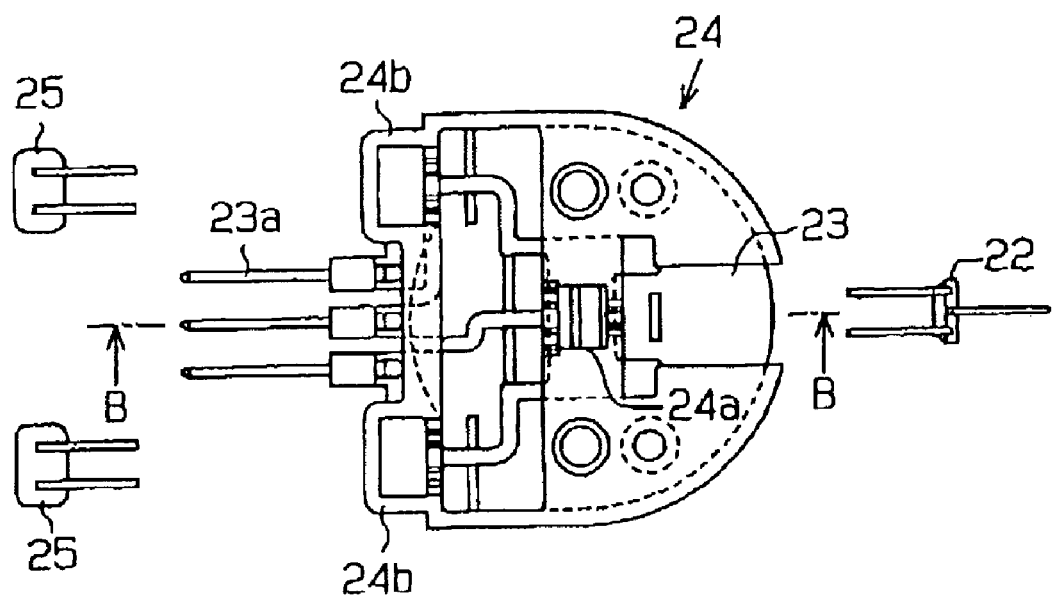
FIG. 2(a) is a plan view illustrating a mold as a first resin mold according to the embodiment of the present invention.
FIG. 2(b) is a cross sectional view of the embodiment of the present invention, taken along a line B-B in FIG. 2(a).
Figure 2:
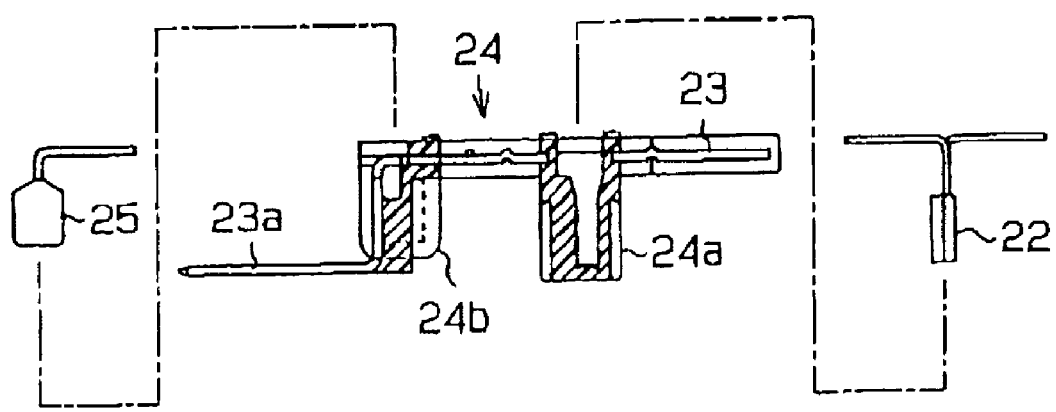

A rotation angular detecting device to which an embodiment of the present invention is applicable is illustrated in FIGS. 1 and 2. A rotation shaft 12 fixed to a detection object (not shown) is inserted and rotatably supported to a housing 11 possessing a basket shape at a main body side of the rotation angular detecting device via a bearing 13. An approximately cylindrical yoke 14 having a bottom portion and made of a magnetic material such as iron is coaxially fixed to a tip portion (an upper portion in FIG. 1(b)) of the rotation shaft 12 by being swaged. An approximately cylindrical resin member 15 is coaxially fixed to an inner periphery of the yoke 14. Plural permanent magnets 16 are disposed in the resin member 15. A rotor includes the rotation shaft 12, the yoke 14, the resin member 15, and the permanent magnet 16. The rotor is rotated corresponding to an angular change of the detection object integrally therewith. Therefore, magnetic flux generated adjacent to the Hall IC 22 is changed along with the rotation of the rotor shaft 12.

The housing 11 is assembled to a connector housing 21 as a second resin mold at an upper end side of the housing 11. The connector housing 21 is formed with resin by an insert mold of a terminal 23 being electrically connected to a Hall IC 22 (a magnetic detecting element) which is an electronic component disposed in the connector housing 21 and held thereby. When the connector housing 21 is assembled to the housing 11, the Hall IC 22 is arranged to be coaxial with the rotation shaft 12 (the rotor). In this case, the permanent magnets 16 arranged around the Hall IC 22 are secured by the resin member 15. Therefore, the magnetic flux generated adjacent to the Hall IC 22 is changed in response to the rotation of the rotation shaft 12 (the permanent magnets 16)

along with the angular change of the detection object. The Hall IC 22 is used for detecting the rotation angle of the detection object by outputting electric voltage corresponding to the magnetic flux.

Next, a detailed structure of the connector housing 21 for holding the Hall IC 22 is described hereinbelow with reference to FIG. 2. FIG. 2 illustrates a mold 24 as a first resin mold formed with resin by an insert mold of the terminal 23. The mold 24 is molded under a condition exposing tip ends 23*a* of the terminal 23 and the mold 24 is formed with a cup shaped portion 24*a* (a positioning portion) for positioning the Hall IC 22 at a predetermined position by inserting the Hall IC 22 therein. The cup shaped portion 24*a* can have a concave portion. Needless to say, the cup shaped portion 24*a* is arranged based upon the terminal 23. The cup shaped portion 24*a* possesses an inner wall surface having substantially at least the same width and depth as width and depth of a body of the Hall IC 22. The Hall IC 22 is inserted in the cup shaped portion 24*a* and positioned relative to the mold 24. Therefore, the Hall IC 22 is positioned based upon the terminal 23 via the mold 24. When the Hall IC 22 is positioned relative to the mold 24, each terminal of the Hall IC 22 is bent on a right angle, and are electrically connected to the terminal 23. Each terminal of the Hall IC 22 is connected with the terminal 23 by using projection welding and the like.

The mold 24 is provided with cup shaped portions 24*b* for disposing capacitors 25 which can remove noise due to the terminal 23. While the capacitors 25 have been disposed in the cup shaped portions 24*b*, bent terminals of each capacitor 25 are electrically connected to the terminal 23. The terminals of each capacitor 25 are also connected with the terminal 23 by using projection welding. When the Hall IC 22 and capacitors 25 are assembled in the mold 24, the connector housing 21 is formed with resin by the insert mold of the terminal 23 covering the mold 24 and the Hall IC 22 with a single unit. In this case, the connector housing 21 is not required to entirely surround the mold 24 and the Hall IC 22 and can surround partially. The connector housing 21 is formed with a connector connecting portion 21*a* under a condition exposing the tip ends 23*a* of the terminal 23 and surrounding the tip ends 23*a*. The Hall IC 22 positioned and held via the connector housing 21 and the mold 24 based upon the terminal 23 is arranged to be coaxial with the rotation shaft 12 (the rotor) when the connector housing 21 is fixed to the housing 11.

As described above, following effects can be obtained according to the embodiment of the present invention.

According to the embodiment of the present invention, the mold 24 is formed with resin by the insert mold of the terminal 23 and possesses the cup shaped portion 24*a* (the positioning portion) for positioning the Hall IC 22 electrically connected to the terminal 23. The connector housing 21 is formed with resin by the insert mold based upon the terminal 23 and surrounds the mold 24 and the Hall IC 22 as a single unit. Therefore, the Hall IC 22 can be positioned at a predetermined position based upon the terminal 23 via the mold 24 (the cup shaped portion 24*a*) and the connector housing 21. Generally speaking, the terminal 23 is made of a material such as a metal member which can not be easily deformed and possesses higher dimensional precision comparing with a resin-made member. Dimensional fluctuation of a resin-made member can be hence restrained by forming the mold 24 and the connector housing 21 with resin by always inserting the terminal 23 into a mold for positioning the Hall IC 22. Further, the Hall IC 22 can be positioned with higher positioning precision.

According to the embodiment of the present invention, the positioning precision of the Hall IC 22 can be effectively improved. Further, the Hall IC 22 can be positioned with higher positioning precision relative to the rotor which changes the magnetic flux generated adjacent to the Hall IC 22 in response to the rotation angle of the rotor. Therefore, fluctuation of the electric voltage outputted from the Hall IC 22 can be restrained and the detecting precision for detecting the rotation angle of the rotor can be effectively improved.

According to the embodiment of the present invention, the mold 24 is provided with the cup shaped portions 24*b* for disposing the capacitors 25. Therefore, assembly of the capacitors 25 can be effectively improved.

According to the embodiment of the present invention, the positioning precision for positioning the Hall IC 22 can be improved in a relatively easy method.

The present invention is not limited only to the above-described embodiment and following modifications can be applicable.

According to the embodiment of the present invention, the mold 24 is formed with the cup shaped portion 24*a* for disposing the Hall IC 22 so as to position the Hall IC 22. Alternatively, the mold 24 can be formed with a projection disposed into a cup shaped member fixed to the Hall IC 22. Still further, the mold 24 can be formed with an engaging claw for engaging the Hall IC 22 to the mold 24 so as to position the Hall IC 22.

According to the embodiment of the present invention, the Hall IC 22 is employed as the magnetic detecting element. However, a magnet resistive element can be employed in substitute for the Hall IC 22.

According to the embodiment of the present invention, the present invention is characterized in the holding structure for holding the Hall IC 22 as the electronic component. However, the present invention can be characterized in holding structures for holding another electronic components.

According to the embodiment of the present invention, the present invention is applicable for the rotation angular detecting device. However, the present invention can be applicable for other devices as well.

The principles, preferred embodiments and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What we claim is:

1. A holding structure of an electronic component comprising:
   a first resin mold formed by resin insert molding with a terminal, the first resin mold possessing a cup-shaped positioning portion for positioning the electronic component to be electrically connected to the terminal, wherein the electronic component is inserted into the cup-shaped positioning portion after the first resin mold is formed; and
   a second resin mold formed by resin insert molding with the terminal, the second resin mold covering the first resin mold and the electronic component which has been electrically connected to the terminal after the electronic component is inserted into the cup-shaped positioning portion.

2. A holding structure of an electronic component according to claim 1, wherein the cup-shaped positioning portion possesses an inner wall surface having at least the same width and depth as the width and depth of a body of the electronic component so as to dispose the electronic component therein.

3. A holding structure of an electronic component according to claim 2 wherein the electronic component is a magnetic detecting element arranged at a predetermined position relative to a rotor for changing a generated magnetic flux in response to a rotation angle thereof.

4. A holding structure of an electronic component according to claim 1 wherein the electronic component is a magnetic detecting element arranged at a predetermined position relative to a rotor for changing a generated magnetic flux in response to a rotation angle thereof.

5. A holding structure of an electronic element according to claim 1, wherein the cup-shaped positioning portion exhibits a concave shape for positioning the electronic element therein.

6. A holding structure of an electronic element according to claim 5, further comprising:
  a rotation shaft rotatably inserted and supported to the second resin mold via a housing;
  a yoke coaxially fixed to the rotation shaft and rotated integrally therewith; and
  plural permanent magnets fixed to an inner periphery of the yoke and surrounding the rotation shaft, wherein the electronic component is arranged coaxially with the rotation shaft.

7. A holding structure of an electronic component according to claim 6 wherein the electronic component is a magnetic detecting element arranged at a predetermined position relative to a rotor for changing a generated magnetic flux in response to a rotation angle thereof.

8. A holding structure of an electronic element according to claim 6, wherein the second resin mold and the permanent magnets are separately positioned to be spaced apart from each other.

9. A holding structure of an electronic element according to claim 5, further comprising:
  a resin member arranged in the yoke for holding the permanent magnet.

10. A holding structure of an electronic component according to claim 9 wherein the electronic component is a magnetic detecting element arranged at a predetermined position relative to a rotor for changing a generated magnetic flux in response to a rotation angle thereof.

11. A holding structure of an electronic element according to claim 9, wherein the second resin mold and the permanent magnets are separately positioned to be spaced apart from each other.

12. A holding structure of an electronic component according to claim 5, further comprising at least one electronic component terminal extending from the electronic component that is positioned in the concave shape positioning portion of the first resin mold, the at least one electronic component terminal being electrically connected to said terminal which is insert molded with said first resin mold.

13. A holding structure of an electronic component according to claim 1, wherein the electronic component comprises a body and at least one electronic component terminal extending from the body, the body being positioned so as to be housed in the cup-shaped positioning portion after resin insert molding the first resin mold, the electronic component terminal being electrically connected to the terminal after positioning the body in the cup-shaped positioning portion.

14. A holding structure of an electronic component according to claim 1 wherein the electronic component is not embedded in the first resin molding by the resin insert molding of the first resin mold.

15. A method for holding an electronic component comprising the steps of:
  forming a first resin mold by resin insert molding with a terminal, the first resin mold possessing a cup-shaped positioning portion for positioning the electronic component to be electrically connected to a terminal;
  inserting the electronic component in the cup-shaped positioning portion of the first resin mold to position the electronic component;
  electrically connecting an electronic component terminal of the electronic component to the terminal with the electronic component positioned in the cup-shaped positioning portion; and
  forming a second resin mold by resin insert molding with the terminal to cover the first resin mold and the electronic component which has been previously positioned in the cup-shaped positioning portion of the first resin mold and electrically connected to the terminal.

16. A method for holding an electronic component according to claim 15, wherein at least one electronic component terminal extends from the electronic component, and further comprising positioning the electronic component in the cup-shaped positioning portion before forming the second resin mold so that at least a portion of the electronic component is housed within the cup-shaped positioning portion, and electrically connecting the at least one electronic component terminal with the terminal that is insert molded with the first resin mold.

17. A holding structure of an electronic component comprising:
  a first resin mold formed by insert molding resin material with a terminal, the resin material of the first resin mold comprising positioning means formed during the insert molding of the first resin mold for positioning the electronic component relative to the terminal after the first resin mold is formed, with the electronic component being electrically connected to the terminal after the insert molding of the first resin mold; and
  a second resin mold formed by insert molding resin with the first resin mold while the electronic component is positioned relative to the terminal by the positioning means, the second resin mold covering the first resin mold and the electronic component which has been electrically connected to the terminal after the electronic component is positioned by the positioning means.

18. A holding structure of an electronic component according to claim 17 wherein the electronic component is a magnetic detecting element arranged at a predetermined position relative to a rotor for changing a generated magnetic flux in response to a rotation angle thereof.

19. A holding structure of an electronic component according to claim 17 wherein the electronic component is not embedded in the resin material of the first resin mold by the resin insert molding of the first resin mold.

* * * * *